United States Patent [19]

Kobayashi et al.

[11] Patent Number: 4,763,611
[45] Date of Patent: Aug. 16, 1988

[54] ELECTRONICALLY CONTROLLED FUEL INJECTION PUMP

[75] Inventors: Tadashi Kobayashi; Shinya Nozaki, both of Higashi-Matsuyama, Japan

[73] Assignee: Diesel Kiki Co., Ltd., Tokyo, Japan

[21] Appl. No.: 928,298

[22] Filed: Oct. 28, 1986

[30] Foreign Application Priority Data

Nov. 22, 1985 [JP] Japan ............................ 60-180268[U]

[51] Int. Cl.$^4$ .............................................. F01P 1/06
[52] U.S. Cl. .................................... 123/41.31; 123/357
[58] Field of Search ...................... 123/41.31, 357, 497, 123/498, 499; 165/80.4

[56] References Cited

U.S. PATENT DOCUMENTS

| | | | |
|---|---|---|---|
| 3,267,333 | 8/1966 | Schultz | 165/80.2 |
| 3,551,758 | 12/1970 | Ferree | 165/80.4 |
| 3,785,354 | 1/1974 | Moulds | 123/478 |
| 4,364,355 | 12/1982 | Karino | 123/41.31 |
| 4,543,914 | 10/1985 | Harris | 123/357 |

*Primary Examiner*—E. Rollins Cross
*Attorney, Agent, or Firm*—Wenderoth, Lind & Ponack

[57] ABSTRACT

An electronically controlled fuel injection pump includes a control unit mounted on a pump body and having an internal cooling passage through which a fuel oil flows to cool electronic components of the control unit. On a wall or surface defining part of the cooling passage, there are disposed elongate ribs for preventing the fuel oil from lying stagnant in the cooling passage.

2 Claims, 2 Drawing Sheets

ELECTRONICALLY CONTROLLED FUEL INJECTION PUMP

FIELD OF THE INVENTION

The present invention relates generally to fuel injection pumps for internal combustion engines, and more particularly to an electronically controlled fuel injection pump in which the injection characteristics are controlled electronically.

PRIOR ART

Electronically controlled fuel injection pumps have been previously proposed. In one such proposed pump disclosed, for example, in Japanese Utility Model Laid-open Publication No. 58-100260, a control unit is mounted on a pump body for improving the matching and connection of the control unit with actuators. The control unit includes an internal cooling passage through which a fuel oil flows to cool electronic components or devices of the control unit, thereby preventing the latter from overheating due to the heat build-up and the engine radiation heat. The cooling passage is comprised solely of a component-receiving chamber which has a cross section that is much larger than the cross sections of inlet and outlet openings of the cooling passage. With the cooling passage thus constructed, the fuel oil tends to lie stagnant at portions in the cooling passage and the stagnant fuel oil creates hot spots which would overheat and damage some electronic components located therein.

SUMMARY OF THE INVENTION

It is accordingly an object of the present invention to overcome and substantially eliminate the foregoing drawbacks of the prior apparatus caused by the stagnant fuel oil in a cooling passage of the control unit.

Another object of the present invention is to provide an electronically controlled fuel injection pump having structural features which make it possible to remove heat from electronic components on a circuit board by cooling the circuit board without direct contact with a fuel oil.

A further object of the present invention is to provide an electronically controlled fuel injection pump having a control unit in which a circuit board is cooled uniformly over the entire surface area thereof.

A still further object of the present invention is to provide an electronically controlled fuel injection pump having a control unit in which electric lead wires can be easily connected with a circuit board.

According to the present invention, the foregoing and other objects are attained by an electronically controlled fuel injection pump of the type having a control unit including electronic components and in internal cooling passage through which a fuel oil flows to cool the electronic components, wherein the improvement comprises at least one elongate projection or rib disposed on a wall defining part of the cooling passage.

With this construction, the rib narrows the cooling passage to thereby produce a throttled flow of the fuel oil, thus enabling the fuel oil to flow smoothly through the cooling passage without stagnation.

Many other advantages, features and other objects of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

Figure 1:
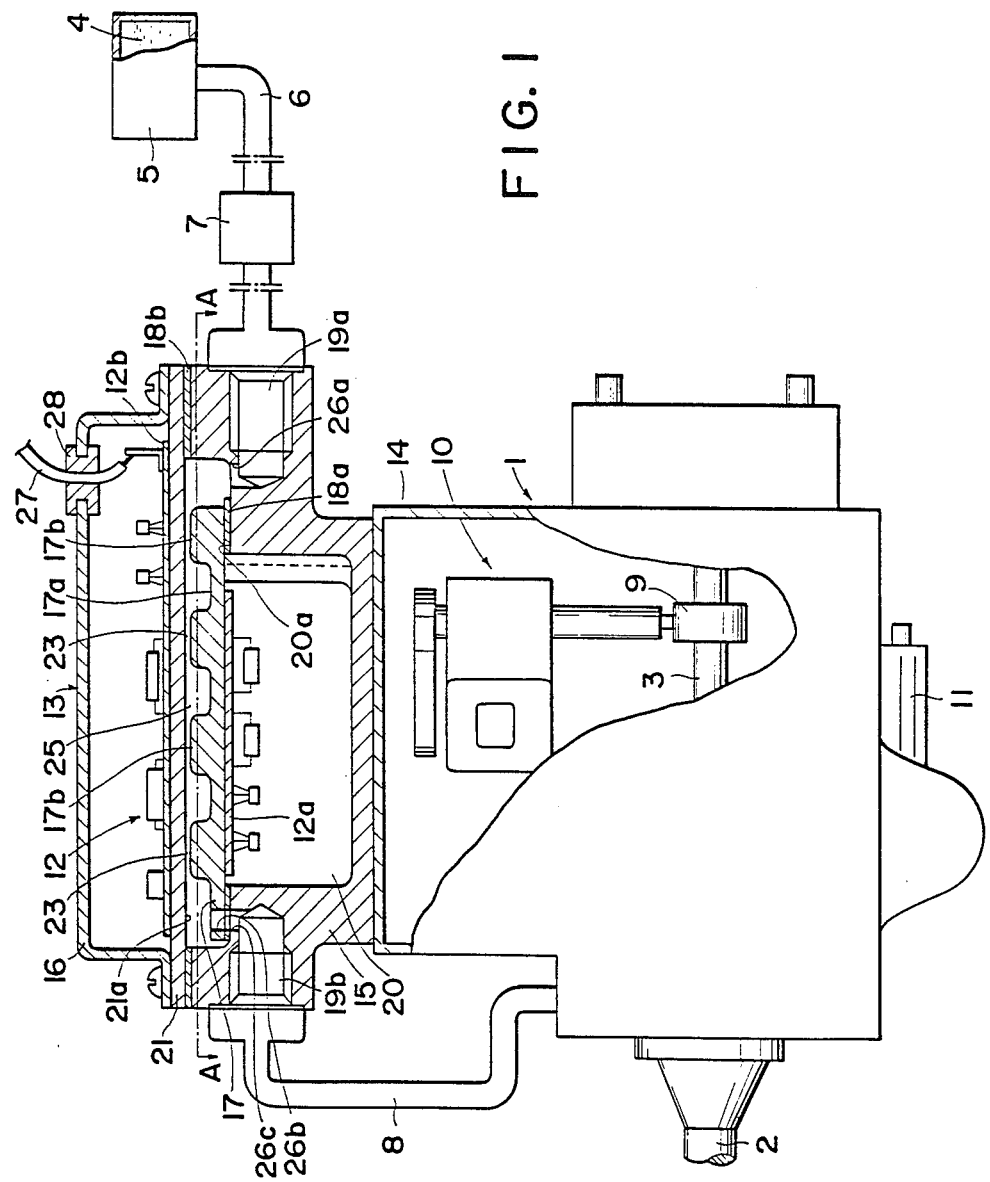
FIG. 1 is a schematic cross-sectional view of an electronically controlled fuel injection pump embodying the present invention.

As shown in FIG. 1, an electronically controlled fuel injection pump includes a pump body 1 having a drive shaft 2 connected in driven relation to a crankshaft of a non-illustrated internal combustion engine for co-rotation therewith, and a plunger 3 operatively connected with the drive shaft 2 for effecting simultaneous rotary and reciprocating movement in response to rotation of the drive shaft 2 in order to inject a fuel oil via a non-illustrated delivery valve. The fuel oil is supplied to the fuel injection pump in such a manner that the fuel oil 4 in a fuel tank 5 is fed through a pipe 6 to a cooling unit 7, and after having been cooled in the cooling unit 7, the fuel oil passes through a cooling chamber 13 and then is delivered through a pipe 8 to a vane pump (not shown) mounted on the drive shaft 2.

The fuel injection pump further includes a control sleeve 9 slidably fitted over the plunger 3 and reciprocally movable to adjust the amount of fuel to be injected in dependence on the displacement of the same with respect to the plunger 3. The control sleeve 9 is connected with an actuator 10 so that the amount of displacement of the control sleeve 9 is controlled by the actuator 10. Designated by numeral 11 is a control timer for adjusting the fuel injection timing. The operation of the timer 11 and the actuator 10 is controlled by a control unit 12 mounted in the cooling chamber 13.

Figure 2:
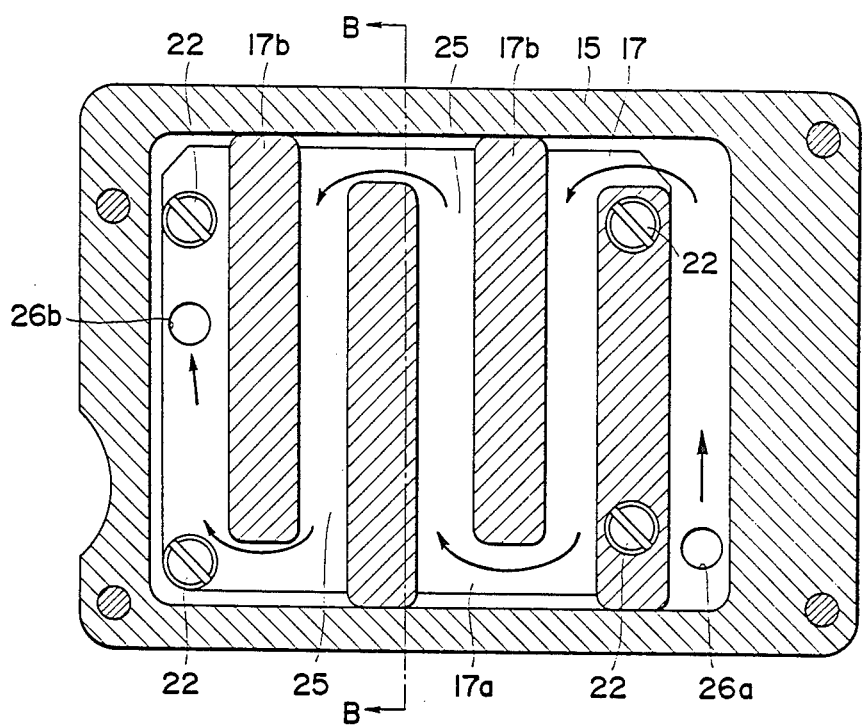
FIG. 2 is a cross-sectional view taken along line A—A of FIG. 1.
Figure 3:
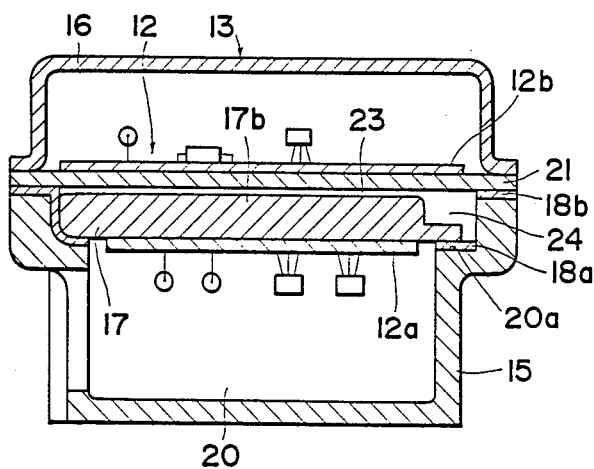
FIG. 3 is a cross-sectional view taken along line B—B of FIG. 2.

The cooling chamber 13 is comprised of a rectangular box-like base member 15 mounted on a casing 14 of the pump body 1 and a cover 16 secured by screws to an open side of the base member 15, with an upper heat-transfer plate 21 interposed between the base member 15 and the cover 16. The heat-transfer plate 21 is preferably made of metal having a high degree of thermal conductivity, such as aluminum and extends across the interior of the cooling chamber 13. An upper seal member 18b made of rubber is disposed between the base member 15 and the heat-transfer plate 21 to provide a fluid-tight seal therebetween. The base member 15 includes a fuel inlet 19a and a fuel outlet 19b defined in the peripheral wall thereof in opposed relation for receiving therein an end of the pipes 7, 8, respectively. A lower heat-transfer plate 17 is disposed on a stepped portion 20a of the base member 15 and is secured thereto by four screws 22 thereby defining therebetween a space 20 for receiving therein a circuit board. The lower heat-transfer plate 17 is made of the same material as the upper heat-transfer plate 21. A lower seal member 18a made of rubber is interposed between the plate 17 and the step portion 20a to provide a fluid-tight seal therebetween for blocking the flow of the fuel oil 4 into the circuit board-receiving space 20. The upper and lower heat-transfer plates 21, 17 are disposed parallel to one another with their inner walls or surfaces 21a, 17a confronting each other. The lower heat-transfer plate 17 includes a plurality of parallel spaced elongate projections or ribs 17b disposed on the inner surface 17a and projecting therefrom toward the upper heat-transfer plate 21, the ribs 17b terminating short of the inner surface 21a with a space 23 defined therebetween. As shown in FIG. 2, the elongate ribs 17b have a length smaller than the distance between opposed side walls of the base member 15 and they are arranged in staggered relation to one another so that there connecting channels 24 are defined (FIG. 3) between one end of the ribs 17b and the side wall of the base member 15 adjacent thereto. The inner surfaces 21a, 17a of the upper and lower heat-transfer plates 21, 17 and the elongate ribs 17b jointly define therebetween a zig-zag cooling passage 25.

The cooling passage 25 communicates at one of its opposite ends with the fuel inlet 19a through a first connecting hole 26a defined in the base member 15, the other end of the cooling passage 25 communicating with the fuel outlet 19b successively through a second connecting hole 26b in the lower heat-transfer plate 17 and through a third connecting hole 26c in the base member 15.

The fuel oil 4, which has been fed from the tank 4 into the fuel inlet 19a, flows through the spaces 23 and the cooling passage 25 in zig-zag fashion toward the fuel outlet 19b, as indicated by the arrows shown in FIG. 2.

The upper and lower heat-transfer plates 21, 17 support upper and lower circuit boards 12b, 12a, respectively, secured to outer surfaces of the respective plates 21, 17, the circuit boards 12b, 12a including electronic components or devices and hence constituting an essential part of the control unit 12.

While the fuel injection pump is in operation, the electronic components generate heat. The heat thus generated is transferred, successively through the circuit boards 12a, 12b and through the heat-transfer plates 17, 21, to the fuel oil 4 flowing through the cooling passage 25 and the spaces 23. With a heat-removing circuit thus formed, the circuit boards 12a, 12b are cooled uniformly over their entire surface areas and hence the electronic components mounted on such circuit boards 12a, 12b are protected from being damaged due to overheating.

The elongate ribs 17b have dual functions, i.e. they define the zig-zag cooling passage 25 having a reduced cross section to throttle the flow of the fuel oil 4, thus enabling the fuel oil 4 to flow smoothly through the cooling passage 25 without stagnating, and the ribs 17b increase the entire surface area of the heat-transfer plate 17 and hence improve the thermal conductivity.

The number of circuit boards is not limited to two as in the illustrated embodiment. Therefore, a single circuit board may be employed. Furthermore, in the illustrated embodiment, the elongate ribs 17b are provided on only one heat-transfer plate 17 because the circuit board 12a carried on this plate 17 has a greater heat release value than the circuit board 12b. However, it is possible to provide such elongate ribs on the other heat-transfer plate 21 in either confronting or staggered relation to the ribs 17b of the plate 17, thereby defining a cooling passage.

The fuel outlet 19b may be directly connected with the pump body 1 without the agency of the pipe 8. Although in the illustrated embodiment the amount of fuel to be injected is adjusted in dependence on the displacement of the control sleeve 9 with respect to the plunger 3 as the control sleeve 9 is operated by the actuator 10, such an adjustment of the fuel injection may be effected by a solenoid valve disposed in a fuel inlet line or a fuel overflow line to open and close the same.

Obviously, many modifications and variations of the present invention are possible in light of the above teachings. It is therefore to be understood that within the scope of the appended claims, the invention may be practiced otherwise than as specifically described.

What is claimed is:

1. In an electronically controlled fuel injection pump having a pump body, a control unit mounted on the pump body and including a circuit board having electronic components, and an internal cooling passage through which fuel oil flows for cooling the electronic components, the improvement comprising:

at least one heat transfer plate interposed between the circuit board and the cooling passage for transferring heat generated by the electronic components to the fuel oil flowing through the cooling passage, the circuit board mounted to one side surface of the heat transfer plate and part of the cooling passage defined by the other side surface of the heat transfer plate opposite said one side surface, and the heat transfer plate having a plurality of parallel elongate ribs extending on said other side surface thereof, said ribs disposed in a staggered relation for establishing a zig-zag path over which the fuel oil flows in said part of the cooling passage.

2. An improvement in an electronically controlled fuel injection pump as claimed in claim 1, wherein said at least one heat transfer plate comprises two heat transfer plates disposed opposite to one another across said cooling passage.

* * * * *